United States Patent
Kussick

(10) Patent No.: US 7,159,591 B2
(45) Date of Patent: Jan. 9, 2007

(54) KUSSICK MANDIBULAR ADVANCEMENT APPLIANCE

(76) Inventor: Leon Kussick, 3884 Clipper Cove Dr., Naples, FL (US) 34112

( * ) Notice: Subject to any disclaimer, the term of this patent is extended or adjusted under 35 U.S.C. 154(b) by 0 days.

(21) Appl. No.: 10/429,743

(22) Filed: May 6, 2003

(65) Prior Publication Data

US 2004/0224277 A1 Nov. 11, 2004

(51) Int. Cl.
*A61F 5/56* (2006.01)

(52) U.S. Cl. .......................................... 128/848; 128/861

(58) Field of Classification Search ..................... 433/6, 433/60; 128/848, 859, 860, 861
See application file for complete search history.

(56) References Cited

U.S. PATENT DOCUMENTS 5,885,073 A * 3/1999 Kussick .......................... 433/6

* cited by examiner

*Primary Examiner*—Cary E. O'Connor
*Assistant Examiner*—Candice C. Stokes

(57) ABSTRACT

The invention provides for a prefabricated appliance for correcting many types of malocclusions particular useful for young children. The appliance for use for adults is called a mandibular advancement appliance. The appliance engages the front upper teeth of a patient in a box. There are lateral occlusions extending to the back of the appliance, Below the retention box there are two independent from each other and depending inclines which engage to the rear of the front teeth. The inclines are hinged in a friction fit. The appliance can be used by an adult for improved breathing as well as by a child with malocclusions. There is a C-shaped bridge, bridging the two lateral occlusions to thereby form a channel into which the adult's tongue or a child's tongue can extend for a comfortable swallowing fit. The adult's appliance does not exert any tension to the interior of the lower teeth. However, a child's lower teeth are subjected to a programmed light tension to exert a correct muscle tension on the lower teeth and to thereby bring the lower jaw mandibular bone structure forward and upward. As a result the malocclusions of a child's teeth and jaw are being progressivly adjusted over a period of time.

5 Claims, 4 Drawing Sheets

KUSSICK MANDIBULAR ADVANCEMENT APPLIANCE

BACKGROUND OF THE INVENTION

The invention relates to an orthopedic incline for the early correction of malocclusions that have a bilateral stabilizing and retention contact with the upper buccal occlusal and incisor teeth. This contact simplifies the new fitting retention process and fixes correctly the angle of incline of the depending segments, called the orthopedic incline. This appliance is the subject of the inventor's prior U.S. Pat. No. 5,885,073 under the title of "Orthopedic Incline Appliance and Method". This patent is incorporated into this new application by reference and fully describes the known appliance that is prefabricated for correcting some types of malocclusions. The following will be included in this application to gain a proper understanding of the improvements made in the appliance at hand:

The prior art appliance comprises:

a) a teeth engaging box for engaging the upper front teeth having a cavity into which the engaged teeth will fit;

b) a palatal stabilizing segment attached to the teeth engaging box and adapted to bilateral contact against the palatal tissue when the teeth engaging box engages the upper front teeth; and c) a pair of forwardly positioned spaced apart and inclined remodeling segments extending from the front of the teeth engaging box downward and rearward at a predetermined angle.

The remodeling segment is hereinafter called the "orthopedic incline". This type of an appliance is mostly recommended to guide the mid-face growth of jaws in young children when the mandibular (lower jaw) its muscle attachments and the bones of the child, especially, the mandible, are still immature and they can still be relocated the easiest. The upper incisors are situated in the teeth engaging box against the floor of this box and the orthopedic incline will rest against the lateral lower incisor. This will result in the mandible rotating forward and then up in a counter clockwise direction as it is guided by the steep inclines and the lateral incisal edges which may be contacted by the spaced apart front positioned faces of the orthopedic inclines. This is so because it can happen that often the two lower lateral incisors, may not be perfectly lined up whereby only one of the orthopedic inclines will make contact whereby the inner surface of the other orthopedic incline will have to be ground away or grooved to correct this misalignment. But not if there are hinged individual inclines.

As will be explained below, the improvement of the invention at hand will make the front positional orthopedic inclines movable by way of a hinge to conform to the patient's comfort of the facial muscles and joints.

Experimentation has shown that the above described appliance is also usable as an aid to improve the air space (oral pharynx) behind the base of the tongue of a person. However, it has been found that under certain circumstances, especially with adults, the orthopedic inclines of the invention may avoid confusing occlusal or altering the patient's bite as a side effect which is undesirable. Therefore, this will also be alleviated by hinging the orthopedic inclines. This will also be explained below.

Attention is directed to U.S. Pat. No. 5,779,470 issued to the inventor of the invention at hand. This appliance contains two thin upper arch (maxilla) lateral occlusal troughs under the biting surface of the upper jaw's posterior teeth which will be helpful to obtain lateral stability and retention of the appliance, while sleeping.

BRIEF SUMMARY AND OBJECTS OF THE INVENTION

In view of all of the above the inventive concept of this invention includes the best of the above cited patents plus a new concept. The patent '073 is being modified by including two lateral occlusal or posterior troughs of patent '470 but instead of the posterior palatal contacts there is provided a new forward channel or bridge to guide the tongue into a reproduceable certain forward position for more normal swallowing. This way, there are now established three point retentions bilateral buccal occlusal teeth and incisal contacts for retention which greatly enhance the retention of the device because it encircles the back teeth bilaterally. This greatly contributes to this appliance as a mandibular advancement device, while sleeping. Again, the applicant has found that if the two front depending orthopedic inclines are hinged, the necessary tension of the lower jaws and muscles caused by the orthopedic inclines can be better controlled by making the inclines hinge thus able and resulting in less adjustments clinically. Thereby, the orthopedic inclines can temporarily be adjusted to a more comfortable position of the joints and muscles and afterwards can be fixed in place for adults. This way, one obtains a mandibular advancement device which can be used comfortably over a long period of time without excess adjustment needs both at insertion or later use, without disturbing the line up of existing teeth.

In the above new design system, it is important and more efficient if the appliance receives some aid in holding or retaining the new flexible position of the teeth and lower jaw are in a more correct position and with the muscle tension needed when the above described appliance is worn, that is, if the patient rests the chin on some support. This comfortable chin support aid is in the form of a small and soft ball or more precisely in the form of a lower jaw position retainer or holding device which is worn and supported as adjusted under the chin and resting against the upper chest and further retained there lightly by a neck pad which also has a strap which is adjustable while sleeping, which strap which is adjustable as to tension around the neck. It should not be too tight to invade the person's comfort but tight enough to keep it in place during the nightly sleep or any time when it is convenient. This will keep the chin of the mandible in a desired and certain position as an aid to more effectively retain and activate ate the installed appliance while sleepin for both adults and young growing children.

DETAILED DESCRIPTION OF THE INVENTION

Figure 1:
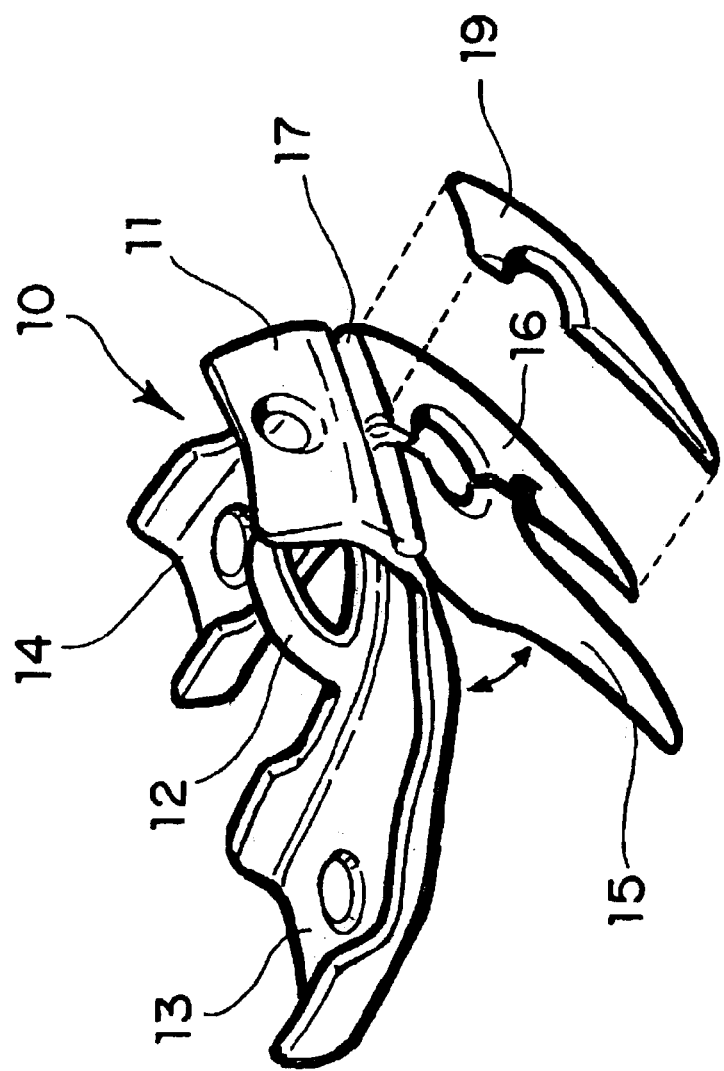
FIG. 1 illustrates a perspective view of the overall hinged appliance.

In FIG. 1, the inventive appliance is denoted as 10 as well in subsequent Figures. The appliance 10 is molded of a polymer such as polycarbonate or other polymeric materials such as an approved biocompatible polymer to fit a wide range of mouths. The appliance 10 includes an upper teeth engaging box 11 for engaging and retaining the upper front teeth (not shown). The appliance further has forward inclines 15 and 16 which are individually and independently hinged to the upper teeth engaging box 11 and below the same. The hinge 17 consists of a ribbed pintle 17 which will be explained below.

The inventive appliance can be used for two different purposes. The first use is for adults where a proper jaw relationship and tomgue posture has already been established between the group of the upper teeth and the group of teeth in the lower mandibular. Such a device is useful for the posterior air space behind the tongue, when placed in the mouth of a patient and to make a comfortable ideal placing of the tongue when sleeping. This is accomplished by placing the tongue in the appliance FIG. 3, under the straddling bow 23 whereby a channel or tunnel 36 is created which is most beneficial when sleeping because the tongue is placed forward for an ideal reproducible swallow.

Figure 2:
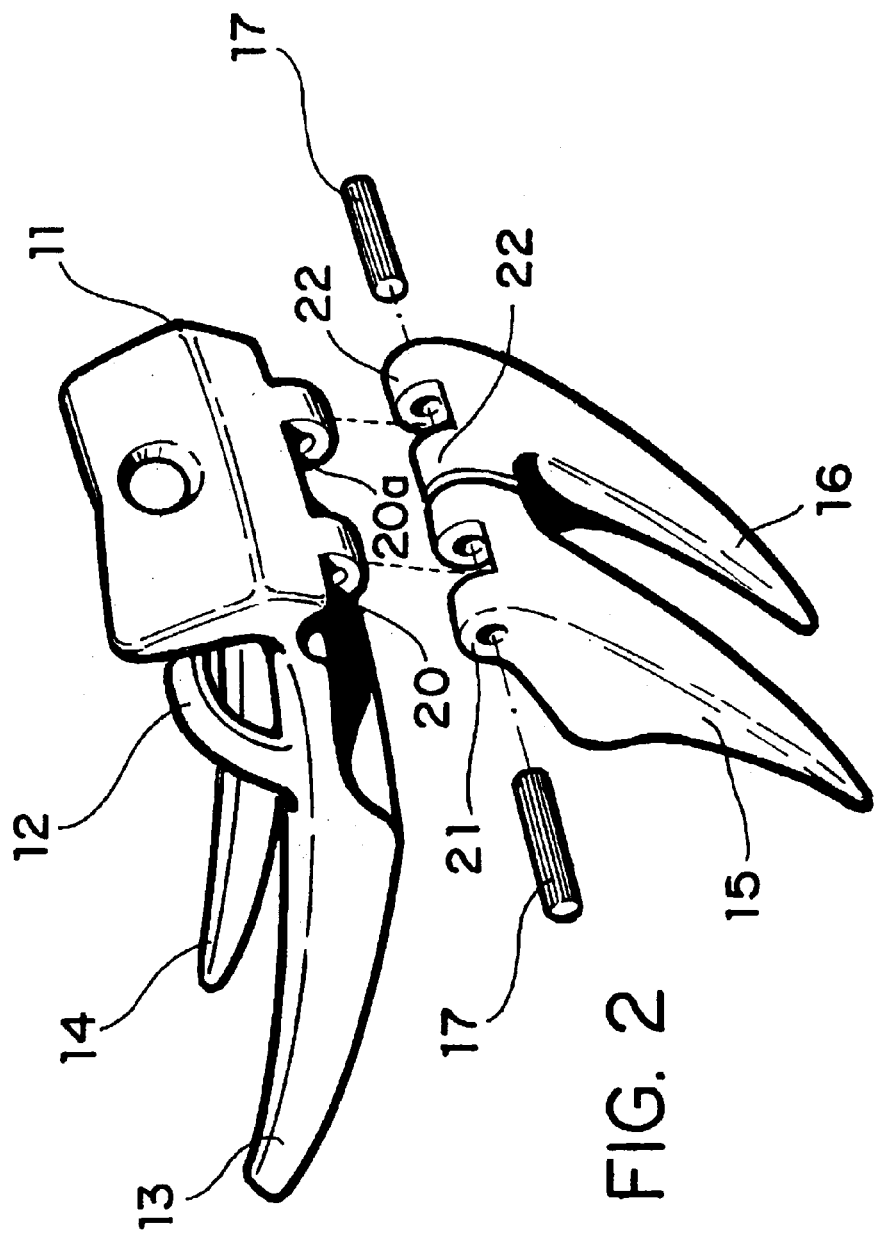
FIG. 2 shows an exploded view of the appliance of FIG. 1.

FIG. 2 shows the appliance wherein the original lateral occlusion troughs have now been reduced in size to palatal contacts 13, 14. The hinged inclines consist of two independent inclines 15 and 16 which are hinged to and below the upper forward box for engaging the upper teeth.

The upper box 11 has eyelets 20 and 20a just below the same to intermesh with eyelets 21 and 22 of the two independent inclines 15 and 16. A pintle 17 interconnects the eyelets 20 and 20a with the eyelets 21 and 22 to form a base for a hinge so that the inclines 15 and 16 can move relative to each other and relative to the box 11. It should be noted that the pintle 17 is serrated or ribbed in a longitudinal direction so that when the pintle is driven into the corresponding eyelets 20 and 20a and 21 and 22, it takes a considerable force to dislodge the inclines 15 and 16 to a different position.

Figure 3:
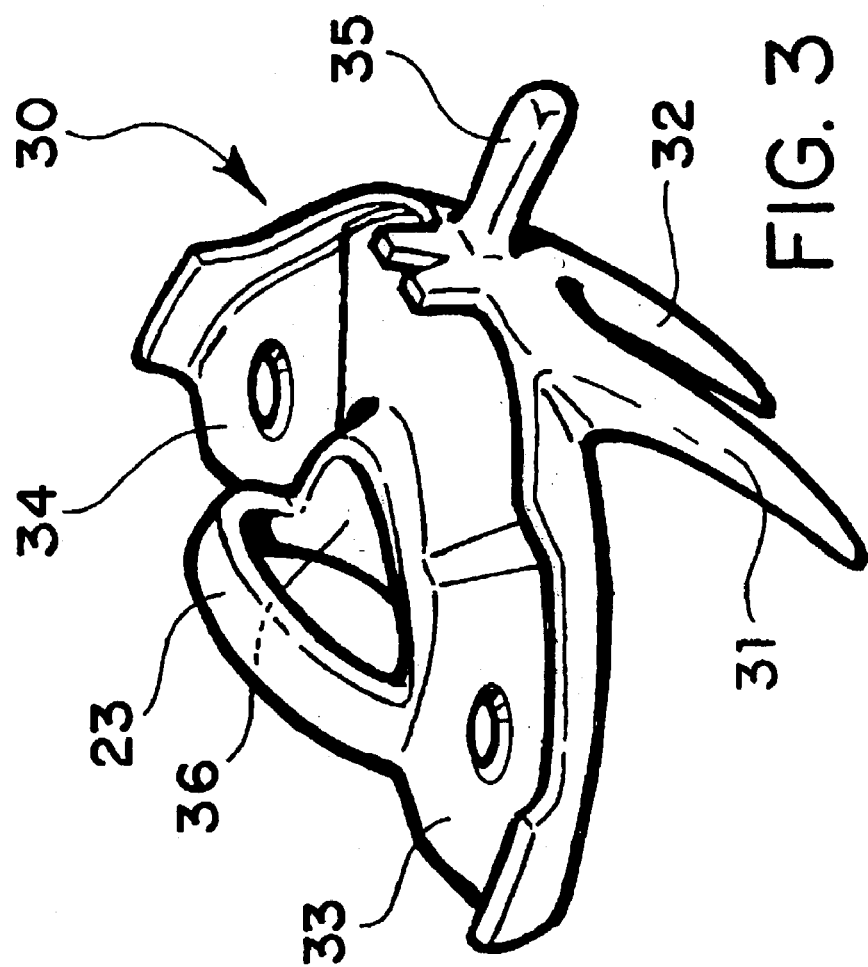
FIG. 3 illustrates the appliance of FIG. 1 without a hinge.

FIG. 3 shows a previous version 30 of the appliance at hand including the inclines 31 and 32 which are not hinged but the appliance shows a C-shaped configuration 23 which spans the lateral occlusions 33 and 34 to establish a channel or tunnel 36 wherein the tongue of the patient may be placed for a comfortable seating and disposition while sleeping.

FIG. 4 shows a different seating of the hinge pintle 17 of FIG. 1 in that the hinge pintle 17 is moved forward or rearward relative to the front retention box 11. This is accomplished by elongating the eyelet openings 42 and 43 (not shown) to a slot 44 and 45 (not shown) whereby the pintle 17 may be moved to a more forward position without losing the frictional force to keep it in an adjusted position. Only 42 is shown in theses views for the hinge seat and 44 is shown for the hinge channel.

Figure 4A:
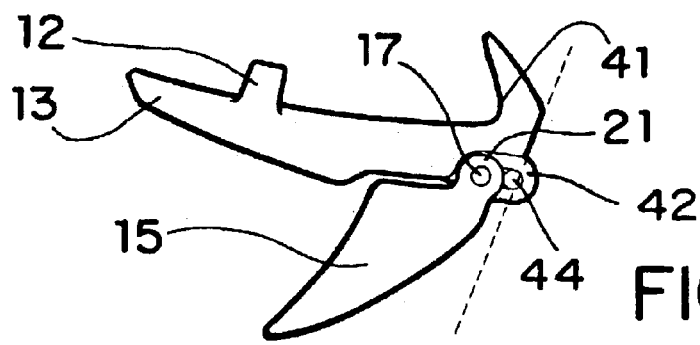
FIGS. 4A to 4D show a different embodiment of the hinge of FIG. 1.

FIG. 4A shows the hinged incline 15 as having been moved to the rear of the hinge channel 44 and is completely hinged back.

Figure 4B:
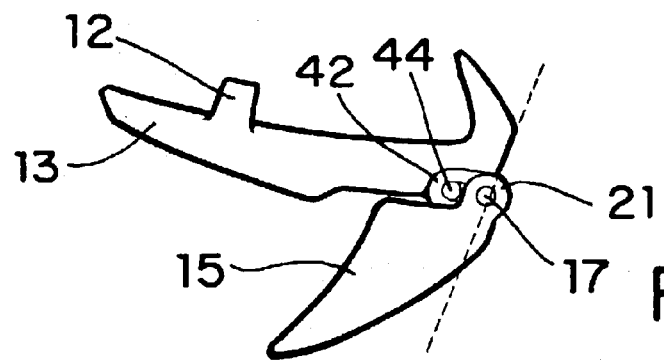

FIG. 4B shows the hinged incline 15 as having been moved forward to the front of the hinge channel 44 but completely hinged back.

Figure 4C:
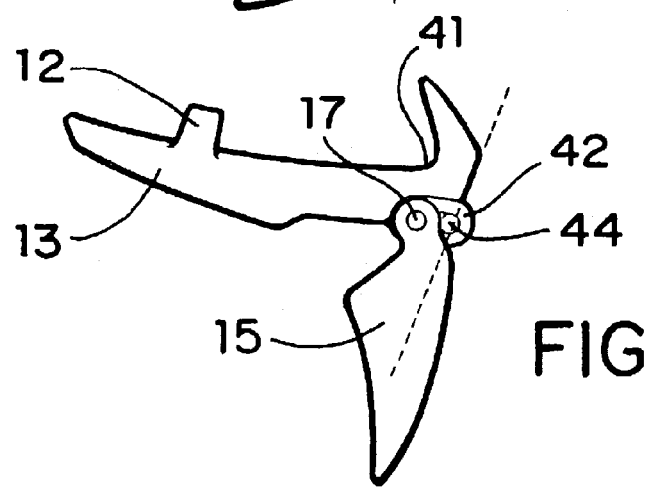
Figure 4D:
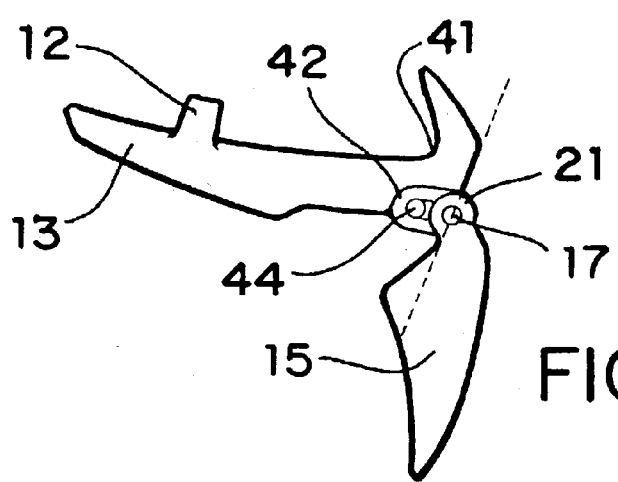

FIG. 4C shows the hinged incline 15 as having been moved to the rear of the of the hinge channel 44 but completely hinged forward.

FIG. 4C shows the hinged incline 15 with its pintle 17 as having been moved forward to the front of the hinge channel 44 but completely hinged forward.

The above illustrated FIGS. 4A–4C clearly show the versatility of the appliance for children in that the hinged inclines 17 can be moved forward or backward under the teeth box 11 and can be hinged through quite a few angles in either position. Of course, the hinge pintle 17 is still ribbed or serrated in a longitudinal direction within the hinge channel 44. This will greatly increase the use of the appliance to accommodate many malocclusions found in many different patients.

The appliance so far explained, is useful in at least two different applications. The first one is for an adult in that the appliance once inserted into a mouth of an adult will adjust the hingedledly inclines to a comfortable position for the patient and will direct the tongue into the channel 36 of the appliance for a most comfortable sleep at night.

The second application is useful for correcting a young child's malocclusions with a deep bite or retruded mandble in correcting a child's misaligned teeth including the lower teeth as well. In this instance, reference is made to the appliance illustrated in FIG. 1. In this FIG. there are shown the adjustable inclines 15 and 16. In many instances it may be advisable to move the inclines different positions. This may be accomplished by making the hinge seats 20 and 20a of elongated slots in a forward direction so that the hinge pintle may be moved forward to assume a different hinging position.

Another way to correct or realign the position of the inclines 15 and 16 is shown in FIG. 1. For additional post-initial fitting adjustments of the appliance, an incline addition segment 19 may be joined to each of the first remodeling inclines 15 and the second remodeling inclines 16. The additional segment 19 can be used to bring the inclined remodeling surface farther up, down and forward, so that they will guide the lower jaw or mandibular to adjust the tension on the muscle attachments of the lower jaw. The additional segments 19 can also be used to adjust the angle of the inclined remodeling surface.

Turning now to FIG. 3, there is shown a mandibular appliance without the hinged inclines but having rigid inclines 31 and 32. This appliance shows a C-shaped bow crossing from the lateral occlusion 33 to the other lateral occlusion 34 to thereby form a tunnel or channel 36 to accommodate the tongue in a forward position as was explained with reference to the C-shaped bow or bridge 12 in FIGS. 1 and 2.

What is claimed is:

1. A dental appliance for fitting to the upper teeth of a patient comprising:

a teeth engaging structure in the form of a box into which forward teeth will be received, a left and a right lateral occlusion extending rearwardly from said box, two side-by-side inclines extending downwardly from said box to seat behind the lower front teeth of a patient, means for frictionally and independently from each other hinging said inclines to move forward or backward, said appliance being useful for an adult or for a young child, a C-shaped bridge spanning said lateral occlusions to form a tunnel for receiving an adult patient's tongue without tensioning said inclines against said lower teeth, means for tensioning said inclines against a child's lower teeth whereby a child's lower mandibular will move forward and upward as the progresses.

2. The dental appliance of claim 1, wherein said means for frictionally hinging includes a pintle having lengthwise ribs along its length to increase the friction when said pintle is seated in hinge eyelets.

3. The dental appliance of claim 1 including an additional segment of material to be fastened to each of the fronts of said inclines to add additional material to the child's incline when time progresses and relinquishes the tension between said inclines and said lower front teeth.

4. The dental appliance of claim 1 including an opening between said inclines for the admission of a quick-set acrylic paste to set said inclines in place.

5. The dental appliance of claim 1 including means for moving said hinge forward or backward under said box for said upper teeth.

* * * * *